United States Patent
Yoh et al.

(10) Patent No.: US 7,159,160 B2
(45) Date of Patent: Jan. 2, 2007

(54) METHOD AND APPARATUS FOR MEASURING SWITCHING NOISE IN INTEGRATED CIRCUITS

(75) Inventors: Gilbert Yoh, Fort Collins, CO (US); Manuel Salcido, Ft. Collins, CO (US); Stan Perino, Ft. Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 295 days.

(21) Appl. No.: 10/872,793

(22) Filed: Jun. 21, 2004

(65) Prior Publication Data

US 2005/0283698 A1 Dec. 22, 2005

(51) Int. Cl.
*G01R 31/28* (2006.01)
*G06F 17/50* (2006.01)

(52) U.S. Cl. .............. 714/724; 716/4; 703/19
(58) Field of Classification Search ............. None
See application file for complete search history.

(56) References Cited

U.S. PATENT DOCUMENTS

| | | | |
|---|---|---|---|
| 6,510,540 B1 * | 1/2003 | Krauter et al. ............... 716/4 |
| 6,772,403 B1 * | 8/2004 | Sasaki ............... 716/6 |
| 6,925,404 B1 * | 8/2005 | Corr ............... 702/117 |
| 7,006,932 B1 * | 2/2006 | Liaw et al. ............... 702/57 |
| 2002/0104064 A1 * | 8/2002 | Sasaki et al. ............... 716/6 |
| 2004/0034840 A1 * | 2/2004 | Chen ............... 716/6 |
| 2004/0098684 A1 * | 5/2004 | Amekawa ............... 716/6 |
| 2004/0158421 A1 * | 8/2004 | Iwanishi ............... 702/69 |

OTHER PUBLICATIONS

Sasaki et al., "Crosstalk Analysis of a 0.13-um-node Test Chip and Precise Gate-Level Simulation Technology", Jun. 15, 2002, IEEE Symposium on VLSI Circuits, pp. 212-215.*
Sinha et al., "Validation and Test Issues Related to Noise Induced by Parasitic Inductances of VLSI Interconnects", Aug. 2002, IEEE Transactions on Advanced Packaging, pp. 329-339.*

* cited by examiner

*Primary Examiner*—Albert Decady
*Assistant Examiner*—John P. Trimmings

(57) ABSTRACT

A simultaneous switching noise (SSN) test circuit and method are provided for measuring effects of SSN. Prior to testing for SSN, a signal is applied to the victim signal input pad and the rise and fall time delays associated with the victim signal are measured at the victim signal output pad. Then, one or more aggressor signals are simultaneously applied to respective input pads of one or more respective aggressor signal paths. The rise and fall time delays of the victim signal transmitted by the output pad are then measured and compared to the previously measured rise and fall time delays to determine effects of SSN on the victim signal caused by the aggressor signals.

18 Claims, 5 Drawing Sheets

METHOD AND APPARATUS FOR MEASURING SWITCHING NOISE IN INTEGRATED CIRCUITS

BACKGROUND OF THE INVENTION

When signal lines of an IC switch state from high to low (i.e., logic 1 to logic 0) or from low to high (i.e., from logic 0 to logic 1) at substantially the same instant in time, the switching of the lines can affect each other. For example, when one signal line, known as the victim signal line, switches from high to low at substantially the same time that multiple other signal lines, known as aggressor signal lines, switch from low to high, the switching of the aggressor signal lines opposite in polarity to the switching of the victim signal line can increase the delay in the transitioning of the victim signal line from high to low (i.e., increase the fall time of the victim signal). When a victim signal line switches from low to high at substantially the same instant in time that multiple aggressor signal lines switch from high to low, the switching of the aggressor signal lines can increase the delay in the transitioning of the victim signal from low to high (i.e., increase the rise time of the victim signal).

When a victim signal line switches from high to low at substantially the same time that multiple aggressor signal lines switch from high to low, the switching of the aggressor signal lines in the same direction of polarity as the victim signal line can speed up the transitioning of the aggressor signal line from high to low (i.e., decrease the fall time of the victim signal). Likewise, when a victim signal line switches from low to high at substantially the same time that multiple aggressor signal lines switch from low to high, the switching of the aggressor signal lines in the same direction of polarity as the victim signal line can speed up the transitioning of the aggressor signal line from low to high (i.e., decrease the rise time of the victim signal).

The effect of the aggressor signal lines on the victim signal line is commonly referred to as simultaneous switching noise (SSN). SSN affects both the output and input source-synchronous data transfer budgets. On the output side, SSN increases the data timing uncertainty with respect to the clock or strobe. This reduces the data valid window because the data valid window is defined as the guaranteed period with respect to the clock or strobe that the data cannot change. On the input side, SSN increases the setup and hold window. The setup and hold window is defined as the period of time with respect to the received clock or strobe that the receiver requires the data to remain stable. Input SSN increases this window by moving the data timing with respect to the clock or strobe, which can result in the data transition being moved into the setup and hold window. Since the setup and hold window is a guaranteed window for budgeting purposes, effects input SSN must be accounted for by increasing the window.

Once the SSN numbers are extracted, SSN is accounted for in the source-synchronous bus timing budget. The output data valid window is computed (both the size and position of the window relative to clock or strobe are important). The setup and hold window is also computed for the input side. It should be noted that SSN jitter is only one component of both these windows. From the input/output (IO) perspective, the setup and hold window must be smaller than the data valid window with some slack. A board designer will design the board such that the data and clock/strobe have flight times (i.e. delay through the wires that transmit the signals between chips) that place the setup and hold window inside the data valid window.

In the past, SSN has been estimated using computer simulation. One known simulation technique simulates switching nine aggressor signal lines simultaneously, or almost simultaneously, with the switching of a victim signal line. During a first part of the simulation, the aggressor signal lines are switched simultaneously with, and opposite in polarity to, the switching of the victim signal line and the effects on the rise and fall times of the victim signal line are measured. In this case, the rise and fall times of the victim signal line will increase due to the fact that the aggressor signal lines are switching in a direction of polarity opposite the direction of polarity of switching of the victim signal line.

The rise and fall times of the victim signal line unaffected by SSN are determined by the simulation program. To determine the effect of SSN on the rise time of the victim signal line when the victim and aggressor signal lines are switched simultaneously and opposite in polarity, the simulation simply determines the difference between the rise time of the victim signal when the aggressor signal lines are not switched (i.e., the rise time unaffected by SSN) and the rise time of the victim signal when the aggressor signal lines are switched (i.e., the rise time as affected by SSN). The difference is an indication of the effect of SSN on the rise time of the victim signal line when the victim and aggressor signal lines are switched simultaneously and opposite in polarity.

Similarly, to determine the effect of SSN on the fall time of the victim signal line when the victim and aggressor signal lines are switched simultaneously and opposite in polarity, the simulation simply determines the difference between the fall time of the victim signal when the aggressor signal lines are not switched (i.e., the fall time unaffected by SSN) and the fall time of the victim signal when the aggressor signal lines are switched (i.e., the fall time as affected by SSN). The difference is an indication of the effect of SSN on the fall time of the victim signal line when the victim and aggressor signal lines are switched simultaneously and opposite in polarity.

During a second part of the simulation, the aggressor signal lines are switched simultaneously and in the same direction of polarity as the switching of the victim signal line. The effect that the switching of the aggressor signal lines has on the rise and fall times of the victim signal line is measured. In this case, both the rise and fall times will have decreased due to the fact that the aggressor signal lines are being switched in the same direction of polarity as the victim signal line.

To determine the effect of SSN on the rise time of the victim signal line when the victim and aggressor signal lines are switched simultaneously and in the same direction of polarity, the simulation simply determines the difference between the rise time of the victim signal when the aggressor signal lines are switched (i.e., the rise time as affected by SSN) and the rise time of the victim signal when the aggressor signal lines are not switched (i.e., the rise time unaffected by SSN). The difference is an indication of the effect of SSN on the rise time of the victim signal line when the victim and aggressor signal lines are switched simultaneously and in the same direction of polarity.

Similarly, to determine the effect of SSN on the fall time of the victim signal line when the victim and aggressor signal lines are switched simultaneously and in the same direction of polarity, the simulation simply determines the difference between the fall time of the victim signal when the aggressor signal lines are switched (i.e., the fall time as affected by SSN) and the fall time of the victim signal when the aggressor signal lines are not switched (i.e., the fall time unaffected by SSN). The difference is an indication of the effect of SSN on the fall time of the victim signal line when the victim and aggressor signal lines are switched simultaneously and in the same direction of polarity.

The description of the simulation given above assumes that the victim and aggressor signal lines are switched at exactly the same instant in time. In actuality, during the first and second parts of the simulation, the aggressor signal lines are swept in time relative to the victim signal line and the rise and fall times are measured. When the aggressor signal lines are swept, they are switched at the same instant in time relative to each other, but at various instants in time both before and after the instant in time at which the victim signal line is switched. The rise and fall times are analyzed by the simulation program separately and the largest deviations in the rise and fall times are classified as jitter.

The rise time jitter corresponds to the largest difference between the rise time when the aggressor signal lines are not switched (i.e., unaffected by SSN) and the rise time when the aggressor signal lines are switched (i.e., as affected by SSN). A rise time jitter value will be determined for the case when the aggressor signal lines are switched in the same direction of polarity as the victim signal line and for the case when the aggressor signal lines are switched in the opposite direction of polarity as the victim signal line.

The fall time jitter corresponds to the largest difference between the fall time when the aggressor signal lines are not switched (i.e., unaffected by SSN) and the fall time when the aggressor signal lines are switched (i.e., as affected by SSN). A fall time jitter value will be determined for the case when the aggressor signal lines are switched in the same direction of polarity as the victim signal line and for the case when the aggressor signal lines are switched in the opposite direction of polarity as the victim signal line.

The simulation program measures input and output SSN separately so that input SSN measurements will not be affected by output SSN, and vice versa. To measure input SSN, the input pad of the victim and the input pads of the aggressor lines are simulated as receiving at the same instant in time, or substantially at the same instant in time (i.e., due to sweeping), but the output pads are not simulated as transmitting at the same instant in time. To measure output SSN, the output pad of the victim signal line and the output pads of the aggressor lines are simulated as transmitting at the same instant in time, or at substantially the same instant in time (i.e., due to sweeping), but the input pads are not simulated as receiving at the same instant in time. Based on the results of the simulation, a determination can be made as to whether input SSN and/or output SSN will cause timing errors to occur.

Although the simulation technique described above is believed to work well for its intended purpose, the accuracy of the simulation, i.e., the degree of correlation between the computer simulation and performance in an actual IC, has never been determined. Accordingly, a need exists for a way to check to accuracy of the computer simulation.

SUMMARY OF THE INVENTION

The present invention provides a simultaneous switching noise (SSN) test circuit for testing input and output SSN and a corresponding method. Prior to testing for SSN, a signal is applied to the victim signal input pad and the rise and fall time delays associated with the victim signal are measured at the victim signal output pad. Then, one or more aggressor signals and the victim signal are simultaneously applied to respective input pads of the respective victim and aggressor signal paths. The rise and fall time delays of the victim signal transmitted by the victim signal output pad are then measured and compared to the previously measured rise and fall time delays to determine effects of SSN on the victim signal caused by the aggressor signals.

In accordance with the preferred embodiment, input SSN measurements and output SSN measurements are obtained independently of each other. In accordance with one embodiment, the aggressor signal path includes a delay element. To test for input SSN, the victim and aggressor signal are applied to their respective input pads at the same instant in time. The delay element in the aggressor signal path prevents the victim and aggressor signals from arriving at their respective output pads at the same instant in time, thereby preventing output SSN from being generated and affecting input SSN measurements.

In accordance with another embodiment, the delay element is located in the victim signal path rather than in the aggressor signal path. The victim and aggressor signal are applied to their respective input pads at the same instant in time. The delay element in the victim signal path prevents the victim and aggressor signals from arriving at their respective output pads at the same instant in time, thereby preventing output SSN from being generated and affecting input SSN measurements.

To test for output SSN effects, the victim and aggressor signals are applied to their respective input pads at different instants in time that are separated by an input delay time $T_{INPUT\_DELAY}$. If the delay element is located in the victim signal path, then the victim signal is applied to the victim signal input pad a time period $T_{INPUT\_DELAY}$ before the aggressor signal is applied to the aggressor signal input pad. This ensures that the victim and aggressor signals will be transmitted at their respective output pads at the same instant in time, but will not be received at their respective input pads at the same instant in time. This ensures that input SSN will not be generated and thus will not affect output SSN measurements. If the delay element is located in the aggressor signal path, then the aggressor signal is applied to the aggressor signal input pad a time period $T_{INPUT\_DELAY}$ before the victim signal is applied to the victim signal input pad.

These and other features and advantages of the present invention will become apparent from the following description, drawings and claims.

DETAILED DESCRIPTION OF THE PREFERRED EMBODIMENT

Figure 1:
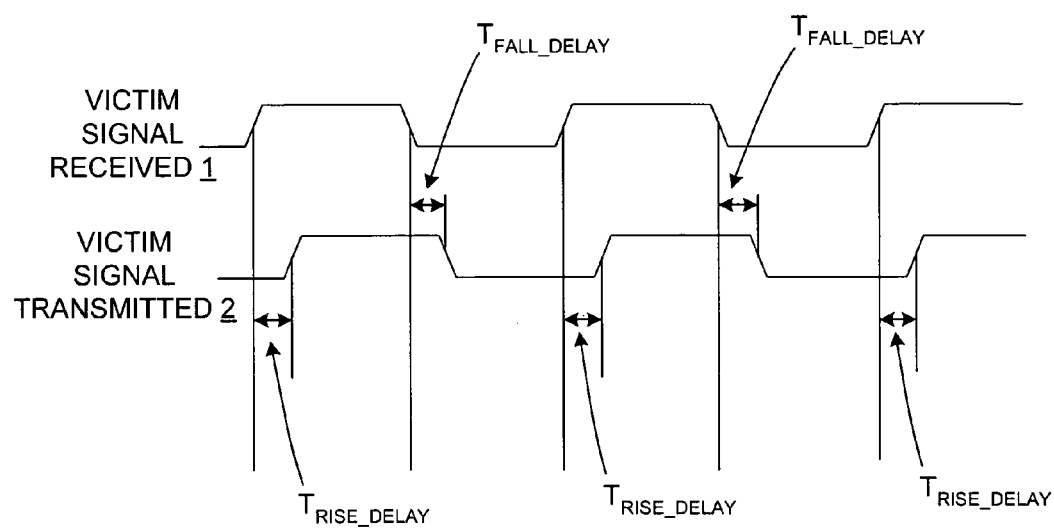
FIG. 1 illustrates a timing diagram that includes a waveform that represents the input signal received at an input pin of the victim signal line and a waveform that represents the output signal transmitted by an output pad of the victim signal line.
Figure 2:
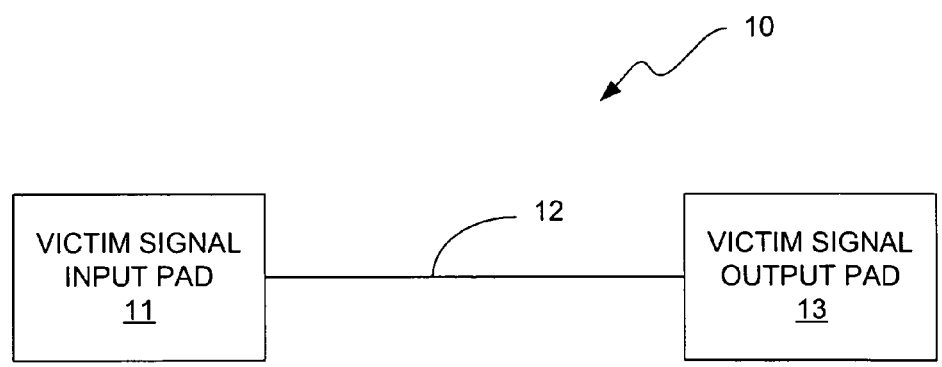
FIG. 2 illustrates block diagram of the victim signal path, which includes a victim signal input pad, a victim signal output pad and a conductive trace that connects the input and output pads.

FIG. 1 illustrates a timing diagram that includes a waveform 1 that represents the input signal received at an input pad of the victim signal line and a waveform 2 that represents the output signal transmitted by an output pad of the victim signal line. FIG. 2 is a block diagram of the victim signal line path 10, which includes a victim signal line input pad 11, a victim signal line output pad 13 and a conductive trace 12 that connects the input and output pads 11 and 13.

The length of the conductive trace 12 produces a delay in the victim signal between the time the victim signal is received at the input pad 11 and the time that the victim signal is transmitted by the output pad 13. The line delay results in a rise time delay, $T_{RISE\_DELAY}$, and a fall time delay, $T_{FALL\_DELAY}$, as shown in FIG. 1. The rise and fall time delays $T_{RISE\_DELAY}$ and $T_{FALL\_DELAY}$ shown in FIG. 1 correspond to the rise and fall time delays for the victim signal line when there is no additional delay caused by SSN from aggressor signal lines.

Figure 3:
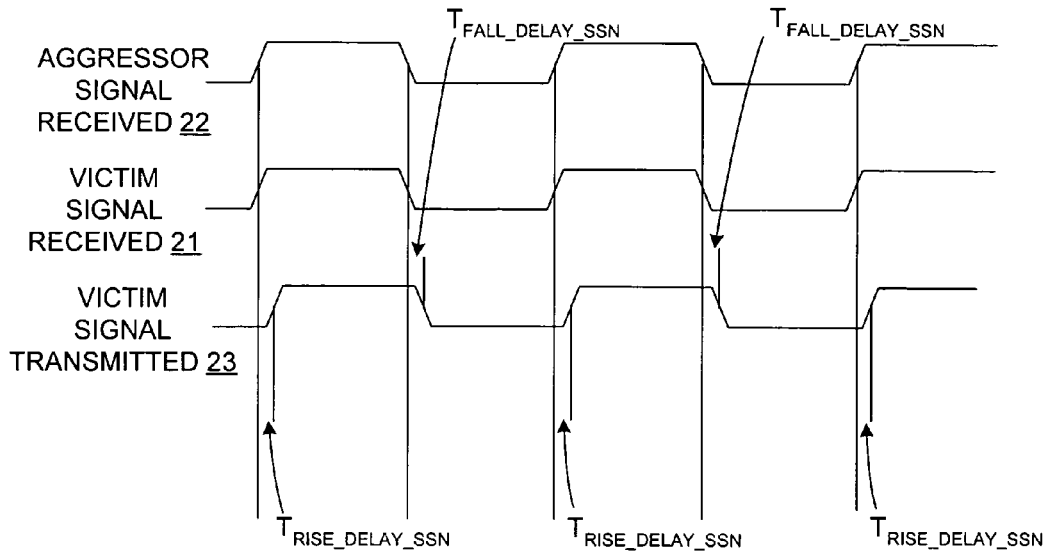
FIG. 3 illustrates a timing diagram that demonstrates the effect of simultaneous switching noise (SSN) on the victim signal at the victim signal input pad when an aggressor signal switches simultaneously with the switching of the victim signal and in the same direction of polarity.

FIG. 3 illustrates a timing diagram that demonstrates the effect of SSN on the victim signal at the victim signal input pad when an aggressor signal switches simultaneously with the switching of the victim signal and in the same direction of polarity. The timing diagram includes a waveform 21 that represents the input signal received at an input pad of a victim signal line, a waveform 22 that represents the input signal received at an input pad of an aggressor signal line and a waveform 23 that represents the output signal transmitted at an output pad of the victim signal line.

By comparing FIG. 1 and FIG. 3, it can be seen that the rise and fall time delays of the victim signal decrease when an aggressor signal line switches simultaneously with the switching of the victim signal line and in the same direction of polarity. The decreased rise and fall time delays are labeled in FIG. 3 as $T_{RISE\_DELAY\_SSN}$ and $T_{FALL\_DELAY\_SSN}$. The magnitude of the decrease in rise time of the victim signal at the input pad of the victim signal line can be calculated by taking the difference between the rise time delay shown in FIG. 1 and the rise time delay shown in FIG. 3 using the following equation:

$$T_{RISE\_DELAY\_SSN\_IN} = T_{RISE\_DELAY} - T_{RISE\_DELAY\_SSN} \quad (Eq.1)$$

The calculated difference in rise time delay is an indication of the effect of SSN on the rise time of the victim signal at the input pad.

The magnitude of the reduction in fall time at the victim input pad caused by SSN from an aggressor signal line is calculated by taking the difference between the fall time delay shown in FIG. 1 and the fall time delay shown in FIG. 3 using the following equation:

$$T_{FALL\_DELAY\_SSN\_IN} = T_{FALL\_DELAY} - T_{FALL\_DELAY\_SSN} \quad (Eq.2)$$

The calculated difference in fall time delay is an indication of the effect of SSN on the fall time of the victim signal at the input pad.

Figure 4:
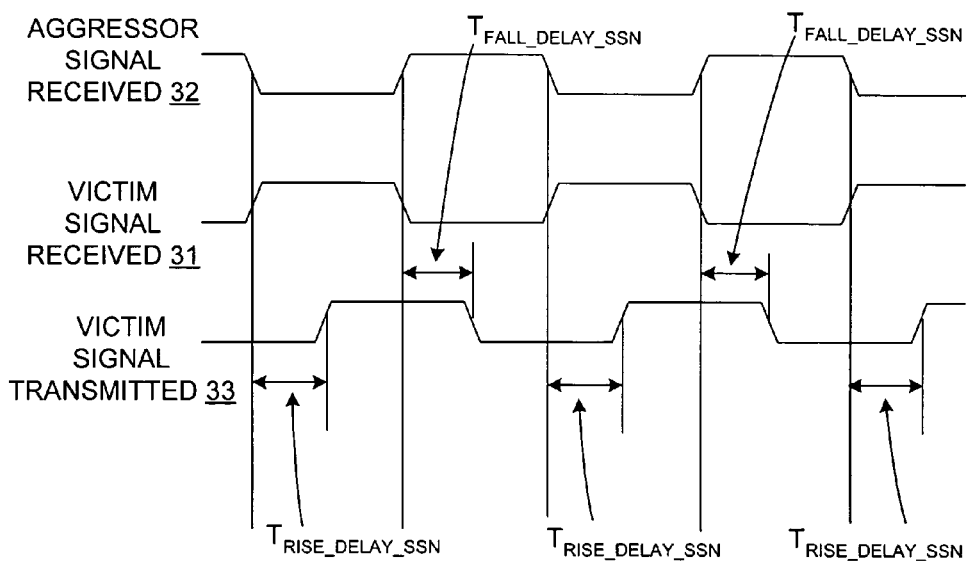
FIG. 4 illustrates a timing diagram that demonstrates the effect of SSN at the victim signal input pad caused by an aggressor signal that switches simultaneously with the switching of the victim signal and in the opposite direction of polarity.

FIG. 4 illustrates a timing diagram that demonstrates the effect of SSN on the victim signal at the victim signal input pad when an aggressor signal switches simultaneously with the switching of the victim signal and in the opposite direction of polarity. The timing diagram includes a waveform 31 that represents an input signal received at an input pad of a victim signal line, a waveform 32 that represents the input signal received at an input pad of an aggressor signal line and a waveform 33 that represents the output signal transmitted at an output pad of the victim signal line.

By comparing FIGS. 1 and 4, it can be seen that the rise and fall time delays of the victim signal increase as a result of an aggressor signal line switching simultaneously with the switching of the victim signal line and in the opposite direction of polarity. In this case, the magnitude of the increase in rise time delay of the victim signal at the victim input pad is calculated by subtracting the victim rise time delay shown in FIG. 1 from the victim rise time delay shown in FIG. 4 using the following equation:

$$T_{RISE\_DELAY\_SSN\_IN} = T_{RISE\_DELAY\_SSN} - T_{RISE\_DELAY} \quad (Eq.3)$$

The increased rise time delay is an indication of the effect that SSN has on the rise time of the victim signal at the victim input pad when the victim and aggressor signals switch simultaneously and in the opposite direction of polarity.

The increase in fall time delay at the victim input pad caused by SSN produced by an aggressor signal switching simultaneously with the switching of the victim signal and oppositely in polarity is calculated by subtracting the victim fall time delay shown in FIG. 1 from the victim fall time delay shown in FIG. 4 using the following equation:

$$T_{FALL\_DELAY\_SSN\_IN} = T_{FALL\_DELAY\_SSN} - T_{FALL\_DELAY} \quad (Eq.4)$$

The increase in fall time delay is an indication of the effect that SSN has on the fall time of the victim signal at the victim input pad when the victim and aggressor signals switch simultaneously and oppositely in polarity.

Figure 5:
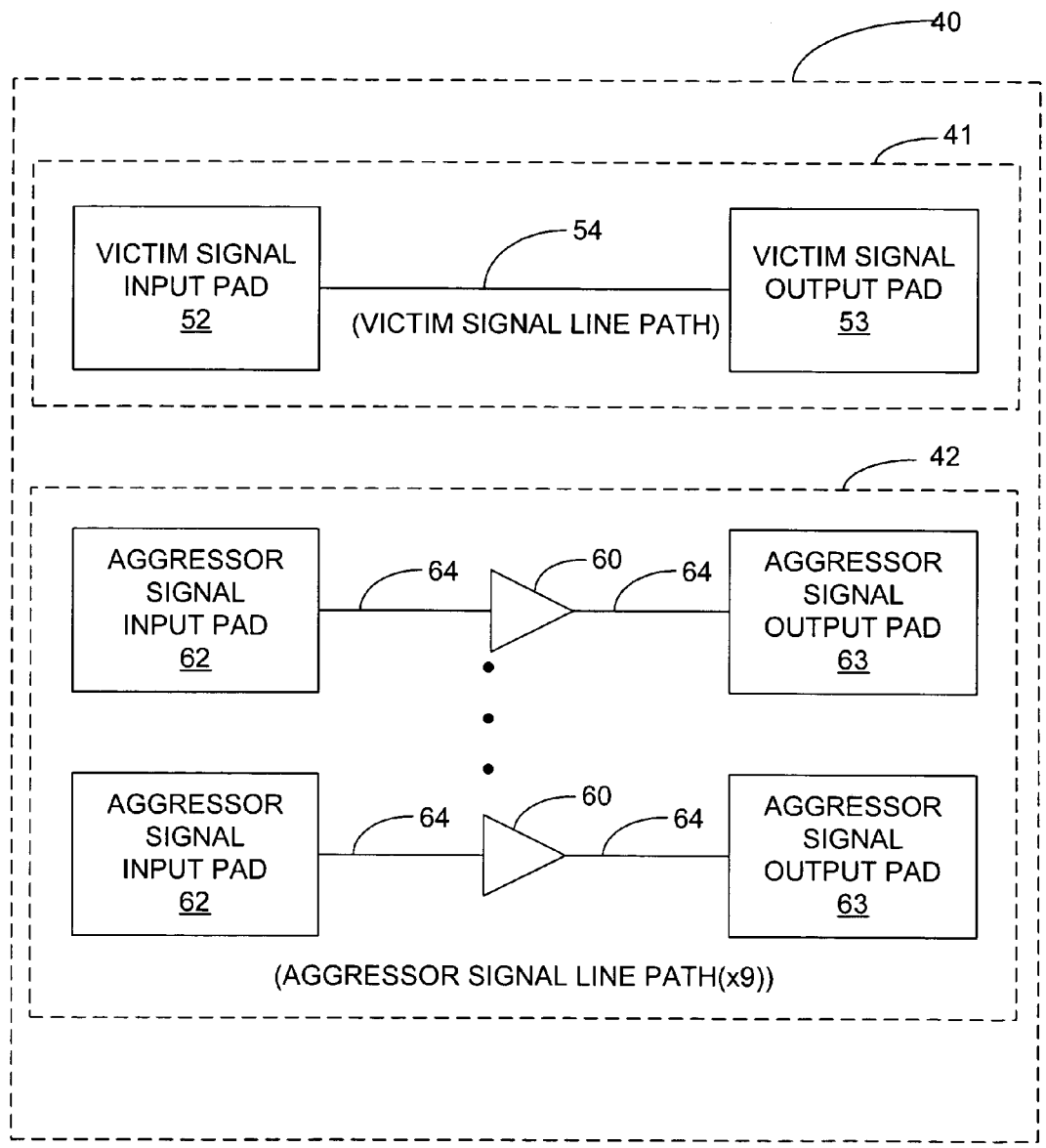
FIG. 5 illustrates a block diagram of an SSN test circuit in accordance with an embodiment of the present invention.

In accordance with the preferred embodiment of the present invention, the victim and aggressor waveforms are generated using an SSN test circuit formed in an IC. The aggressor and victim waveforms are then analyzed to determine the actual effects of SSN on the victim signal. FIG. 5 illustrates a block diagram of an SSN test circuit in accordance with an embodiment of the present invention. The circuit 40 has a victim signal line path 41 and an aggressor signal line path 42.

The victim signal line path 41 comprises a victim input pad 52, a victim output pad 53 and a conductive trace 54 that conductively couples the victim input pad 52 to the victim output pad 53. The victim input and output pads 52 and 53 typically include a buffer (not shown) made up of one or more transistors (not shown) that drive the signals received at the pads with the appropriate signal strength.

Each of the aggressor signal line paths 42 preferably is identical to the victim signal line path 41 in all respects except that the aggressor signal line paths 42 also include a delay element 60 that is not included in the victim signal line path 41. Each of the aggressor signal line paths 42 comprises an aggressor input pad 62, an aggressor output pad 63, the delay element 60 and a conductive trace 64 that conductively couples the aggressor input pad 62 to the delay element 60 and the delay element 60 to the output pad 63.

Preferably, multiple aggressor signal line paths (e.g., nine) are used to produce sufficient SSN to affect the victim signal rise and fall times. In FIG. 5, nine aggressor signal line paths 42 are represented, which preferably run parallel to and in close proximity with the victim signal line path 41. The present invention is not limited with respect to the total number of aggressor signal line paths employed in the test circuit 40.

The purpose of the delay element 60 is to prevent the aggressor signal from arriving at the aggressor output pad 63 at the same time that the victim signal arrives at the victim output pad 53. It is known that in order for SSN to cause jitter on the victim signal line, the aggressor signal lines typically must be switching at substantially the same instant in time as the victim signal lines. Therefore, if the aggressor signal lines are switching at a different time from the victim signal line, they do not affect the victim signal line and hence are not aggressors. By placing the delay element 60 in the aggressor signal line paths 42, it is ensured that the victim and aggressor input pads 52 and 62 receive at the same instant in time, and that the victim and aggressor output pads 53 and 63 do not transmit at the same instant in time. In this way, it is ensured that effects of SSN on the victim output will not affect the measurement of SSN effects on the victim input.

It should be noted that the delay element 60 could be placed in the victim signal line path 41 instead of in the aggressor signal line paths 42 with the same results, i.e., the victim and aggressor signals will arrive at the input pads 52 and 62 at the same instant in time, but will arrive at the output pads 53 and 63 at different instants in time. Also, the delay element 60 is not limited to any particular type of element. There are several ways in which signals can be delayed. One suitable approach is simply to increase the length of the conductive trace 64 to a length that is sufficient to produce the desired delay.

Before calculating the effects of SSN on the rise and fall time delays of the victim signal, the rise and fall time delays of the input victim signal are first measured without switching the aggressor signal line path 42. A waveform similar to waveform 1 shown in FIG. 1 is applied to the victim input pad 52 and a waveform similar to waveform 2 shown in FIG. 1 is measured at the victim output pad 53. The rise and fall time delays $T_{RISE\_DELAY}$ and $T_{FALL\_DELAY}$ are determined as discussed above with reference to FIG. 1.

Next, the victim and aggressor input pads 52 and 62 are switched simultaneously, either in the same or opposite directions of polarity, depending on which portion of the test is being performed. Assuming for exemplary purposes that the victim and aggressor input pads 52 and 62 are first switched in the same directions of polarity, a waveform similar to waveform 23 shown in FIG. 3 will be measured at the victim output pad 53. The rise and fall time delays measured at the victim output pad 53 will have decreased for the reasons described above with reference to FIG. 3. Using these measured values, the reduced rise time delay is calculated using Equation 1 and the reduced fall time delay is calculated using Equation 2.

Next, the victim and aggressor signal lines are switched simultaneously with and in opposite directions of polarity to the switching of the victim waveform and a waveform similar to waveform 33 shown in FIG. 4 is measured at the victim signal output pad 53. The rise and fall time delays will have increased for the reasons described above with reference to FIG. 4. Using these measured values, the increased rise time delay is calculated using Equation 3 and the increased fall time delay is calculated using Equation 4.

To test for victim output SSN, the victim input signal is not applied to the victim input pad 52 until a time period equal to the time delay of the delay element 60, $T_{ELEMENT\_DELAY}$, after the aggressor input signals have been applied to the aggressor input pads 62. This ensures that the victim and aggressor signals will be transmitted by the victim and aggressor output pads 53 and 63 simultaneously, while preventing the victim and aggressor signals from being received at the input pads 52 and 62 simultaneously.

The difference in time between the instant that the aggressor signals arrive at the aggressor signal input pads 62 and the victim signal arrives at the victim input pad 52 will be referred to as $T_{INPUT\_DELAY}$. If the aggressor and victim input signals are switched in the same direction of polarity, the rise time delay difference at the victim output caused by SSN can be calculated using the following equation:

$$T_{RISE\_DELAY\_SSN\_OUT} = T_{RISE\_DELAY\_SSN} - T_{RISE\_DELAY}, \quad (Eq.5)$$

where $T_{RISE\_DELAY\_SSN}$ is the rise time delay of the victim signal transmitted at the output pad 53 affected by SSN and $T_{RISE\_DELAY}$ is the rise time delay of the victim signal transmitted at the output pad 53 when it is unaffected by SSN.

The decreased fall time delay that occurs when the victim and aggressor signals arrive at the output pads 53 and 63 at the same instant in time and are switched in the same direction of polarity can be calculated as follows:

$$T_{FALL\_DELAY\_SSN\_OUT} = T_{FALL\_DELAY\_SSN} - T_{FALL\_DELAY}, \quad (Eq.6)$$

where $T_{FALL\_DELAY\_SSN}$ is the fall time delay of the victim signal transmitted at the output pad 53 affected by SSN and $T_{FALL\_DELAY}$ is the fall time delay of the victim signal transmitted at the output pad 53 when it is unaffected by SSN.

To test for output SSN when the victim and aggressor signals are switched in opposite directions of polarity, the victim signal is delayed from arriving at the victim signal input pad by the time period $T_{INPUT\_DELAY}$. However, as described above, the victim and aggressor signals are transmitted by the output pads 53 and 63 at the same instant in time. The rise time delay difference at the victim output caused by SSN can be calculated using the following equation:

$$T_{RISE\_DELAY\_SSN\_OUT} = T_{RISE\_DELAY} - T_{RISE\_DELAY\_SSN}, \quad (Eq.7)$$

where $T_{RISE\_DELAY\_SSN}$ is the rise time delay of the victim signal transmitted at the output pad 53 affected by SSN and $T_{RISE\_DELAY}$ is the rise time delay of the victim signal transmitted at the output pad 53 when it is unaffected by SSN.

The decreased fall time delay that occurs when the victim and aggressor signals arrive at the output pads 53 and 63 at the same instant in time and are switched in the same direction of polarity can be calculated as follows:

$$T_{FALL\_DELAY\_SSN\_OUT} = T_{FALL\_DELAY} - T_{FALL\_DELAY\_SSN}, \quad (Eq.8)$$

where $T_{FALL\_DELAY\_SSN}$ is the fall time delay of the victim signal transmitted at the output pad 53 affected by SSN and $T_{FALL\_DELAY}$ is the fall time delay of the victim signal transmitted at the output pad 53 when it is unaffected by SSN.

The values calculated by Equations 1–8 preferably are compared with corresponding values obtained through simulation to determine the accuracy of the simulation program. If the values obtained through simulation are different from the values obtained using the test circuit and method of the present invention, changes can be made to the simulation program to make it more accurate.

Figure 6:
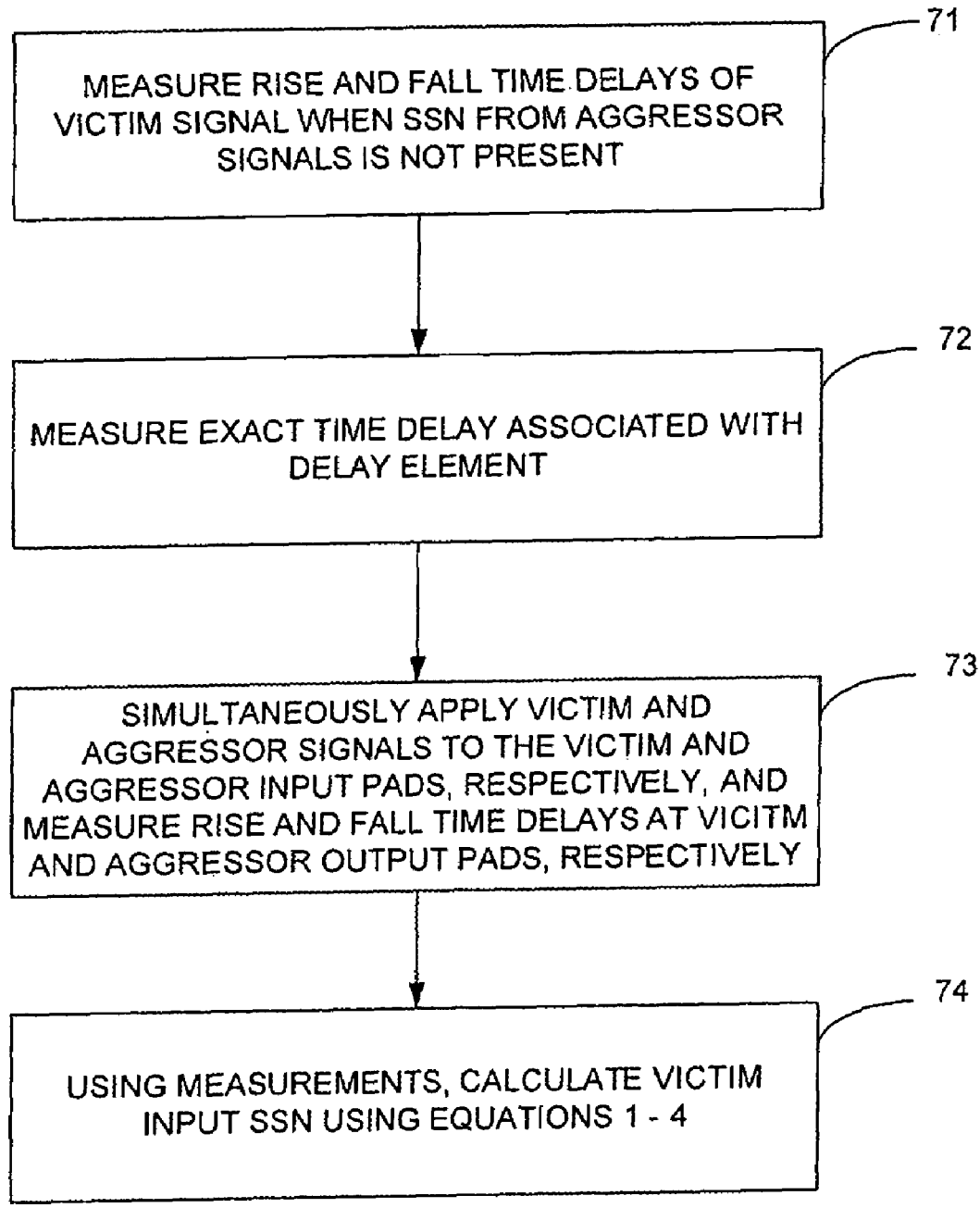
FIG. 6 illustrates a flow chart of the method of the present invention in accordance with an embodiment for measuring effects of input SSN.

FIG. 6 illustrates a flow chart of the method of the present invention in accordance with an embodiment for measuring effects of input SSN. The rise and fall time delays of the victim signal when SSN from aggressor signals is not present is measured, as indicated by block 71. The exact delay time provided by the delay element 60 (FIG. 5) is also measured, as indicated by block 72. The victim and aggressor signals are simultaneously applied to the victim and aggressor input pads and the rise and fall time delays are measured, as indicated by block 73. Either the victim signal or the aggressor signal is delayed to prevent the victim and aggressor signals from arriving at the respective output pads at the same instant in time.

The steps represented by block 73 are performed both for switching with the same polarity and with opposite polarity. Also, the aggressor signals may be swept in the manner described above, in which case measurements will be taken for each set of aggressor signals. Once all of the measurements have been obtained, the victim input SSN is calculated using Equations 1–4, as indicated by block 74.

Figure 7:
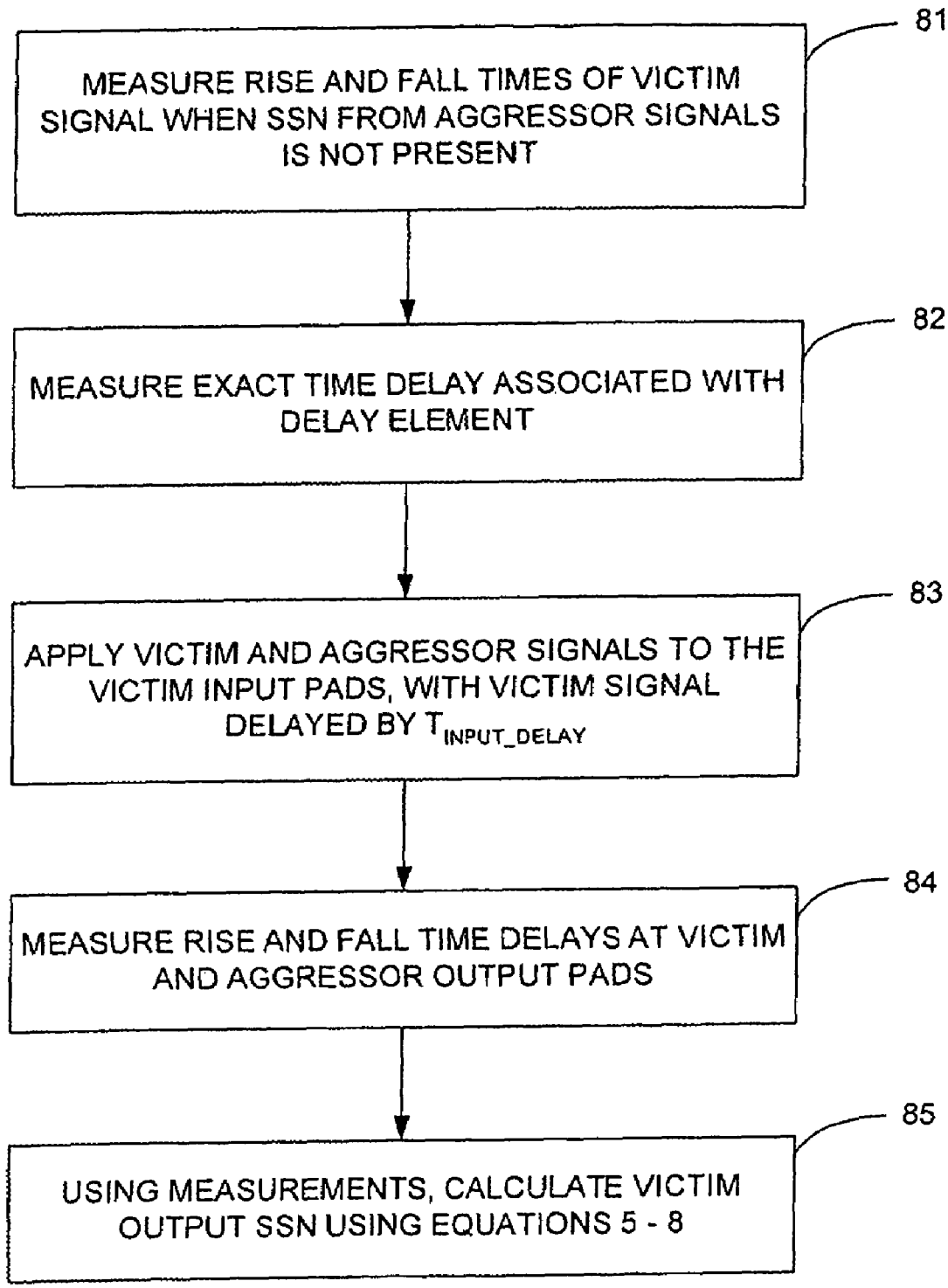
FIG. 7 illustrates a flow chart of the method of the present invention in accordance with an embodiment for measuring effects of output SSN.

FIG. 7 illustrates a flow chart of the method of the present invention in accordance with an embodiment for measuring effects of output SSN. The rise and fall time delays of the victim signal when SSN from aggressor signals is not present is measured, as indicated by block 81. The exact delay time provided by the delay element 60 (FIG. 5) is also measured, as indicated by block 82. If the method represented by FIG. 6 for measuring effects of input SSN has already been performed, the steps represented by blocks 81 and 82 do not need to be performed.

The victim and aggressor signals are applied to the victim and aggressor input pads, with the victim signal being applied later in time than the aggressor signals by an amount $T_{INPUT\_DELAY}$, as indicated by block 83. It should be noted that if the delay element is in the victim path, then the aggressor signal will be applied to the aggressor signal input path a time period $T_{INPUT\_DELAY}$ after the victim signal has been applied to the victim input pad. The rise and fall time delays are measured, as indicated by block 84. This step is performed both for switching with the same polarity and with opposite polarity. Also, the aggressor signals may be swept in the manner described above, in which case measurements will be taken for each set of aggressor signals. Once all of the measurements have been obtained, the effects of SSN on the victim output is calculated using Equations 5–8, as indicated by block 85.

It should be noted that the present invention is not limited with respect to the order in which the steps represented by the blocks in FIGS. 6 and 7 are performed. Also, the steps of using Equations 1–8 to calculate effects of SSN can be performed by hand or by a computer that is programmed to perform the calculations. In the case where a computer is programmed to perform the calculations, preferably the computer will include memory for storing the values represented by the variables shown in Equations 1–8 and for storing the results of the calculations. The computer preferably will also include memory for storing the instructions that perform the calculations. Suitable memory for these purposes may be any type of computer-readable medium, including, but not limited, magnetic storage devices, optical storage devices and solid state storage devices.

For the purposes of describing concepts and principles of the present invention, the present invention has been described with respect to particular embodiments. It should be noted that the present invention is not limited to the embodiments described above, and that the present invention may be carried out in other forms. For example, the test circuit shown in FIG. 5 is one particular test circuit for SSN testing, and not the only circuit that can be configured to perform the tasks of the present invention. Those skilled in the art will understand, in view of the description provided herein, the manner in which changes may be made to the embodiments described herein without deviating from the present invention. All such changes and modifications are within the scope of the present invention.

What is claimed is:

1. A switching noise test circuit comprising:
   a victim signal path comprising a victim signal input pad, a victim signal output pad and a victim conductive signal line connecting the victim signal input pad to the victim signal output pad; and
   a first aggressor signal path comprising at least a first aggressor signal input pad, a first aggressor signal output pad, a first delay element and a first aggressor conductive signal line connecting the first aggressor signal input pad to the input of the first delay element and connecting the output of the first delay element to the first aggressor signal output pad, the delay element configured to delay a first aggressor signal propagating along the first aggressor conductive signal line by a particular amount of time to prevent the aggressor signal from arriving at the first aggressor signal output pad at the same instant in time that a victim signal propagating along the victim conductive signal line arrives at the victim signal output pad.

2. The switching noise test circuit of claim 1, further comprising:
   a second aggressor signal input pad, a second aggressor signal output pad, a second delay element and a second aggressor conductive signal line connecting the second aggressor signal input pad to the input of the second delay element and connecting the output of the second delay element to the second aggressor signal output pad, the second delay element configured to delay a second aggressor signal propagating along the second aggressor conductive signal line by a particular amount of time to prevent the second aggressor signal from arriving at the second aggressor output pad at the same instant in time that a victim signal propagating along the victim conductive signal line arrives at the victim signal output pad.

3. The switching noise test circuit of claim 1, wherein the switching noise test circuit is formed on an integrated circuit (IC), and wherein the IC further comprises:
   a first input pin electrically connected to the victim signal input pad;
   a first output pin electrically connected to the victim signal output pad;
   a second input pin electrically connected to the first aggressor signal input pad; and
   a second output pin electrically connected to the first aggressor signal output pad.

4. The switching noise test circuit of claim 1, wherein the first delay element corresponds to a portion of the first aggressor signal line having a particular length selected to delay the aggressor signal by said particular amount of time.

5. A switching noise test circuit comprising:
   a first aggressor signal path comprising at least a first aggressor signal input pad, a first aggressor signal output pad and a first aggressor conductive signal line connecting the first aggressor signal input pad to the first aggressor signal output pad; and
   a victim signal path comprising a victim signal input pad, a victim signal output pad, a delay element and a victim conductive signal line, the victim conductive signal line connecting the victim signal input pad to the input of the delay element and connecting the output of the delay element to the victim signal output pad, the delay element configured to delay a victim signal propagating along the victim conductive signal line by a particular amount of time to prevent the victim signal from arriving at the victim signal output pad at the same instant in time that the first aggressor signal arrives at the first aggressor signal output pad.

6. The switching noise test circuit of claim 5, further comprising:
   a second aggressor signal input pad, a second aggressor signal output pad and a second aggressor conductive signal line connecting the second aggressor signal input pad to the second aggressor signal output pad, the second aggressor signal arriving at the second aggressor signal output pad at substantially the same instant in time that the first aggressor signal arrives at the first aggressor signal output pad.

7. The switching noise test circuit of claim 5, wherein the switching noise test circuit is formed on an integrated circuit (IC), and wherein the IC further comprises:
   a first input pin electrically connected to the victim signal input pad;
   a first output pin electrically connected to the victim signal output pad;
   a second input pin electrically connected to the first aggressor signal input pad; and
   a second output pin electrically connected to the first aggressor signal output pad.

8. The switching noise test circuit of claim 5, wherein the delay element corresponds to a portion of the victim signal line having a particular length selected to delay the victim signal by said particular amount of time.

9. A method for measuring switching signal noise, the method comprising:
   providing a switching noise test circuit;
   applying a first victim signal to a victim signal input pad of the switching noise test circuit;
   measuring a first victim signal transmitted at a victim signal output pad of the switching noise test circuit to determine a first transition delay associated with the first measured victim signal, the victim signal output pad being connected to the victim signal input pad by a victim conductive signal line;
   applying a second victim signal to the victim signal input pad; applying an aggressor signal to an aggressor signal input pad of the test circuit, the aggressor signal input pad being connected to an aggressor signal output pad by an aggressor conductive signal line;
   measuring a second victim signal transmitted at the victim signal output pad to determine a second transition delay associated with the second measured victim signal; and
   comparing the first transition delay with the second transition delay to determine effects of simultaneous switching noise on the second victim signal.

10. The method of claim 9, wherein the second victim signal and the aggressor signal are applied to the victim signal input pad and to the aggressor signal input pad, respectively, at a same instant in time.

11. The method of claim 10, further comprising:
   delaying the second victim signal after the second victim signal has been applied to the victim signal input pad so that the second victim signal arrives at the victim signal output pad a time period $T_{INPUT\_DELAY}$ after the aggressor signal arrives at the aggressor signal output pad.

12. The method of claim 11, wherein the switching noise test circuit comprises:
   a first aggressor signal path comprising the aggressor signal input pad, the aggressor signal output pad and the aggressor conductive signal line connecting the aggressor signal input pad to the aggressor signal output pad; and
   a victim signal path comprising the victim signal input pad, the victim signal output pad, the victim conductive signal line and a delay element, the victim conductive signal line connecting the victim signal input pad to the delay element and connecting the delay element to the victim signal output pad, the delay element configured to delay the second victim signal propagating along the victim conductive signal line by the time period $T_{INPUT\_DELAY}$ to prevent the second victim signal from arriving at the victim signal output pad at the same instant in time that the aggressor signal arrives at the first aggressor signal output pad.

13. The method of claim 10, further comprising:
   delaying the aggressor signal after the aggressor signal has been applied to the aggressor signal input pad so that the aggressor signal arrives at the aggressor signal output pad a time period $T_{INPUT\_DELAY}$ after the second victim signal arrives at the victim signal output pad.

14. The method of claim 13, wherein the switching noise test circuit comprises:
   a victim signal path comprising the victim signal input pad, the victim signal output pad and the victim conductive signal line connecting the victim signal input pad to the victim signal output pad; and
   a first aggressor signal path comprising the aggressor signal input pad, the aggressor signal output pad, the aggressor conductive signal line and a delay element, the aggressor conductive signal line connecting the aggressor signal input pad to the delay element and connecting the delay element to the aggressor signal output pad, the delay element configured to delay the aggressor signal by the time period $T_{INPUT\_DELAY}$ to prevent the aggressor signal from arriving at the aggressor signal output pad at the same instant in time that the second victim signal arrives at the victim signal output pad.

15. The method of claim 9, wherein the second victim signal and the aggressor signal are applied to the victim signal input pad and the aggressor signal input pad, respectively, at different instants in time, the second victim signal being applied to the victim signal input pad a time period $T_{INPUT\_DELAY}$ after the aggressor signal is applied to the aggressor signal input pad.

16. The method of claim 9, wherein the second victim signal and the aggressor signal are applied to the victim signal input pad and the aggressor signal input pad, respectively, at different instants in time, the aggressor signal being applied to the aggressor signal input pad a time period $T_{INPUT\_DELAY}$ after the second victim signal is applied to the victim signal input pad.

17. A method for measuring switching noise, the method comprising:
- measure rise and fall time delays of a victim signal when signal switching noise (SSN) from one or more aggressor signal lines is not present;
- measure a time delay associated with a delay element;
- simultaneously apply victim and aggressor input signals to victim and aggressor input pads, respectively;
- delay one of the victim and aggressor input signals by a timer period $T_{INPUT\_DELAY}$ to prevent the aggressor and victim signals from arriving at an aggressor signal output pad and at a victim signal output pad, respectively, simultaneously;
- measure rise and fall time delays of victim and aggressor signals transmitted at victim and aggressor output pads, respectively; and
- use the measured rise and fall time delays to determine input SSN.

18. A method for measuring switching noise, the method comprising:
- measure rise and fall time delays of a victim signal when signal switching noise (SSN) from one or more aggressor signal lines is not present;
- measure a time delay associated with a delay element;
- apply victim and aggressor input signals to victim and aggressor input pads, respectively, the victim and aggressor signals being applied at instants in time separated by a time period $T_{INPUT\_DELAY}$;
- delay one of the victim and aggressor input signals by a timer period $T_{INPUT\_DELAY}$ to prevent the aggressor and victim signals from arriving at an aggressor signal output pad and at a victim signal output pad, respectively, simultaneously;
- measure rise and fall time delays of victim and aggressor signals transmitted at victim and aggressor output pads, respectively; and
- use the measured rise and fall time delays to determine output SSN.

* * * * *